United States Patent
Becken et al.

(10) Patent No.: US 7,371,143 B2
(45) Date of Patent: May 13, 2008

(54) OPTIMIZATION OF PARAMETERS FOR SEALING ORGANIC EMITTING LIGHT DIODE (OLED) DISPLAYS

(75) Inventors: Keith J. Becken, Avoca, NY (US); Stephan L. Logunov, Corning, NY (US); Kamjula P. Reddy, Corning, NY (US); Joseph F. Schroeder, III, Corning, NY (US); Holly J. Strzepek, Bath, NY (US)

(73) Assignee: Corning Incorporated, Corning, NY (US)

( * ) Notice: Subject to any disclaimer, the term of this patent is extended or adjusted under 35 U.S.C. 154(b) by 531 days.

(21) Appl. No.: 10/970,319

(22) Filed: Oct. 20, 2004

(65) Prior Publication Data

US 2006/0082298 A1    Apr. 20, 2006

(51) Int. Cl.
  *H01J 9/26* (2006.01)
(52) U.S. Cl. .......................................... 445/25; 65/33.5
(58) Field of Classification Search ............ 445/23–25; 313/498–512; 315/169.3; 345/36, 45, 76; 65/33.5, 33.6
See application file for complete search history.

(56) References Cited

U.S. PATENT DOCUMENTS

| | | | |
|---|---|---|---|
| 6,021,648 A * | 2/2000 | Zonneveld et al. .......... 65/33.5 |
| 6,129,603 A * | 10/2000 | Sun et al. ...................... 445/25 |
| 6,195,142 B1 | 2/2001 | Gyotoku et al. .............. 349/69 |
| 6,848,964 B1 * | 2/2005 | Sasaki et al. ................. 445/25 |
| 2001/0048234 A1 * | 12/2001 | Liu et al. ........................ 297/3 |
| 2003/0066311 A1 | 4/2003 | Li et al. ......................... 65/43 |
| 2005/0001545 A1 | 1/2005 | Aitken et al. ............... 313/512 |
| 2005/0151475 A1 * | 7/2005 | Sasaki et al. ............... 313/582 |

FOREIGN PATENT DOCUMENTS

| | | |
|---|---|---|
| WO | WO2004/094331 | 11/2004 |
| WO | WO2004/095597 | 11/2004 |

OTHER PUBLICATIONS

"Crank Mathematics of Diffusion", Oxford Press, 1957.

* cited by examiner

*Primary Examiner*—Joseph Williams
*Assistant Examiner*—Christopher M. Raabe
(74) *Attorney, Agent, or Firm*—Thomas R. Beall; William J. Tucker (57) ABSTRACT

A hermetically sealed glass package and method for manufacturing the hermetically sealed glass package are described herein. In one embodiment, the hermetically sealed glass package is suitable to protect thin film devices which are sensitive to the ambient environment. Some examples of such glass packages are organic emitting light diode (OLED) displays, sensors, and other optical devices. The present invention is demonstrated using an OLED display as an example.

27 Claims, 9 Drawing Sheets

1 - beam 108 centered between two closely located electrodes 106a and 106b (intermediate velocity)

2 - beam 108 between two distant electrodes 106b and 106c (slow velocity)

3 - beam 108 centered on electrode 106c (fast velocity)

OPTIMIZATION OF PARAMETERS FOR SEALING ORGANIC EMITTING LIGHT DIODE (OLED) DISPLAYS

BACKGROUND OF THE INVENTION

1. Field of the Invention

The present invention relates to hermetically sealed glass packages that are suitable to protect thin film devices which are sensitive to the ambient environment. Some examples of such glass packages are organic emitting light diode (OLED) displays, sensors, and other optical devices. The present invention is demonstrated using an OLED display as an example.

2. Description of Related Art

OLEDs have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). OLED displays are known to be very bright and to have a good color contrast and wide viewing angle. However, OLED displays and in particular the electrodes and organic layers located therein are susceptible to degradation resulting from interaction with oxygen and moisture leaking into the OLED display from the ambient environment. It is well known that the life of the OLED display can be significantly increased if the electrodes and organic layers located therein are hermetically sealed from the ambient environment. Unfortunately, in the past it has been very difficult to develop a sealing process to hermetically seal the OLED display. Some of the factors that made it difficult to properly seal the OLED display are briefly mentioned below:

- The hermetic seal should provide a barrier for oxygen ($10^{-3}$ cc/m$^2$/day) and water ($10^{-6}$ g/m$^2$/day).
- The size of the hermetic seal should be minimal (e.g., <2 mm) so it does not have an adverse effect on size of the OLED display.
- The temperature generated during the sealing process should not damage the materials (e.g., electrodes and organic layers) within the OLED display. For instance, the first pixels of OLEDs which are located about 1-2 mm from the seal in the OLED display should not be heated to more than 100° C. during the sealing process.
- The gases released during sealing process should not contaminate the materials within the OLED display.
- The hermetic seal should enable electrical connections (e.g., thin-film chromium electrodes) to enter the OLED display.

Today one way to seal the OLED display is to form a hermetic seal by melting a low temperature frit doped with a material that is highly absorbent at a specific wavelength of light. In particular, a high power laser is used to heat up and soften the frit which forms a hermetic seal between a cover glass with the frit located thereon and a substrate glass with OLEDs located thereon. The frit is typically ~1 mm wide and ~6-100 um thick. If the absorption and thickness of the frit is uniform then sealing can be done at constant laser energy and speed so as to provide a uniform temperature rise at the frit location. However, when the frit is relatively thin then 100% of the laser energy is not absorbed by the frit and some of the laser energy can be absorbed or reflected by metal electrodes that are attached to the OLEDs on the substrate glass. Since it is desirable to use thin frits and the metal electrodes have different reflectivity and absorption properties as well as different thermal conductivities from the bare substrate glass, this situation can create an uneven temperature distribution within the frit during the sealing process which can lead to a non-hermetic connection between the cover glass and the substrate glass. This sealing problem is solved by using one or more of the sealing techniques of the present invention.

BRIEF DESCRIPTION OF THE INVENTION

The present invention includes a hermetically sealed OLED display and method for manufacturing the hermetically sealed OLED display. Basically, the hermetically sealed OLED display is manufactured by depositing a frit (e.g., doped frit) onto a cover plate and by depositing OLEDs onto a substrate plate. A laser (e.g., sealing apparatus) is then used to heat the frit in a manner where a substantially constant temperature is maintained within the frit along a sealing line while the frit melts and forms a hermetic seal which connects the cover plate to the substrate plate and also protects the OLEDs located between the cover plate and the substrate plate. There are several sealing techniques described herein that enable the laser to heat the frit in a manner where a substantially constant temperature is maintained within the frit along the sealing line which is difficult to accomplish because the sealing line has regions occupied by electrodes that are connected to the OLEDS and regions that are free of the electrodes. For instance in one sealing technique, the speed and/or power of a laser beam emitted from the laser is dynamically changed as needed to ensure that the frit is uniformly heated along the sealing line which has electrode occupied regions and electrode free regions.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Referring to FIGS. 1-10, there are disclosed in accordance with the present invention a hermetically sealed OLED display 100 and method 200 for manufacturing the OLED display 100. Although the sealing techniques of the present invention are described below with respect to manufacturing the hermetically sealed OLED display 100, it should be understood that the same or similar sealing techniques can be used to seal two glass plates to one another that can be used in a wide variety of applications and device. Accordingly, the sealing techniques of the present invention should not be construed in a limited manner.

Figures 1A, 1B:
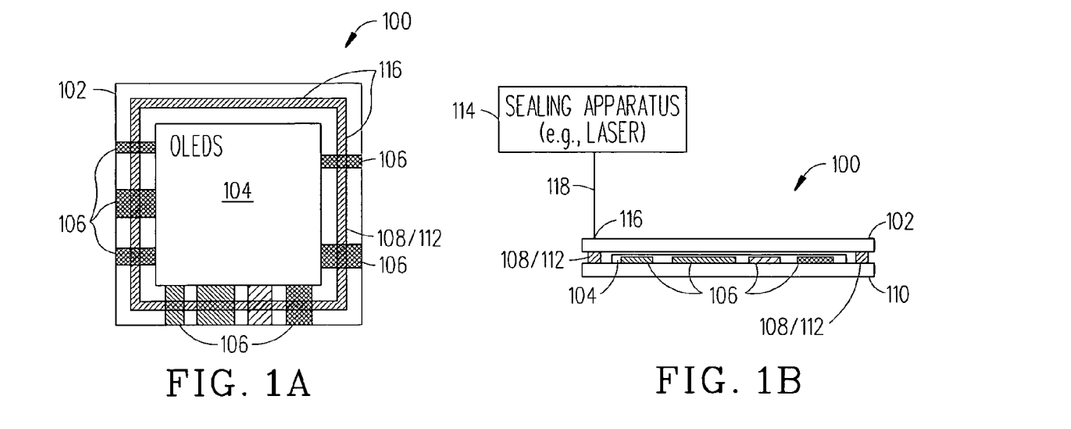
FIGS. 1A and 1B are respectively a top view and a cross-sectional side view illustrating the basic components of a hermetically sealed OLED display that can be made by using one or more of the sealing techniques of the present invention.

Referring to FIGS. 1A and 1B, there are respectively show a top view and a cross-sectional side view that illustrate the basic components of the hermetically sealed OLED display 100. The OLED display 100 includes a multilayer sandwich of a cover plate 102 (e.g., glass plate 102), one or more OLEDs 104/electrodes 106, a doped frit 108 and a substrate plate 110 (e.g., glass plate 110). The OLED display 100 has a hermetic seal 112 which was formed from the frit 108 that protects the OLEDs 104 located between the cover plate 102 and the substrate plate 110. The hermetic seal 112 is typically located just inside the outer edges of the OLED display 100. And, the OLEDs 104 are located within a perimeter of the hermetic seal 112. As can be seen, the electrodes 106 which are connected the OLEDs 104 pass/extend through the hermetic seal 112 so they can connect to an external device (not shown). Again, it is the presence of the electrodes 106 which are often non-transparent metal electrodes 106 that makes it difficult to form a hermetic connection 112 between the cover plate 102 and the substrate plate 110. This is because the metal electrodes 106 have different patterns and different optical properties such that some of the laser energy from a sealing apparatus 114 (e.g., laser 114) is absorbed and/or reflected by the metal electrodes 106 which creates an uneven temperature distribution in the frit 108 during the sealing process which can lead to the formation of a non-hermetic connection between the cover plate 102 and the substrate plate 110. How this problem is solved by using one or more of the sealing techniques of the present invention so it is possible to make the OLED display 100 is described below with respect to FIGS. 2-10.

Figure 2:
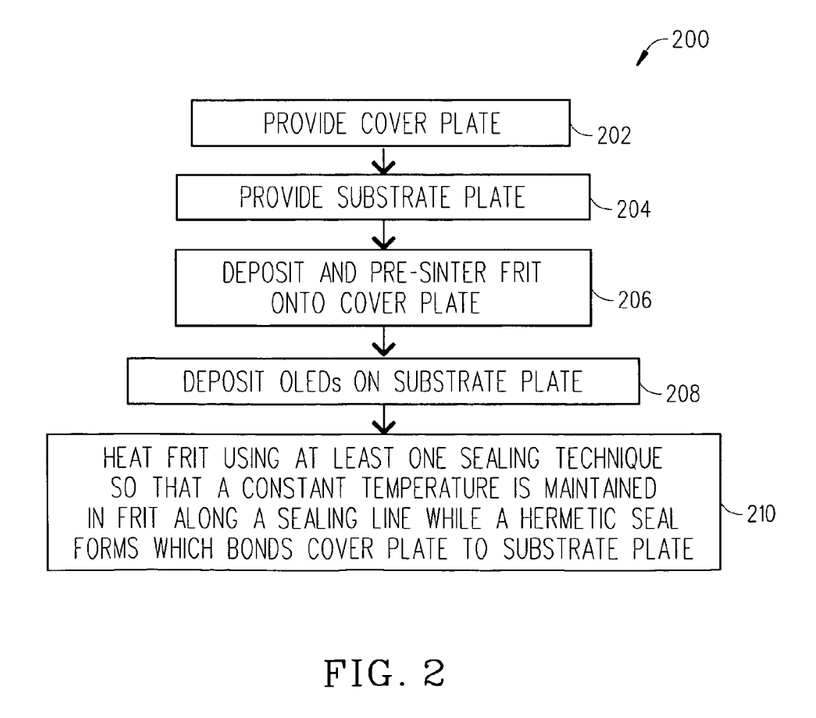
FIG. 2 is a flowchart illustrating the steps of a preferred method for manufacturing the hermetically sealed OLED display shown in FIGS. 1A and 1B.

Referring to FIG. 2, there is a flowchart illustrating the steps of the preferred method 200 for manufacturing the hermetically sealed OLED display 100. Beginning at steps 202 and 204, the cover plate 102 and the substrate plate 110 are provided. In the preferred embodiment, the cover and substrate plates 102 and 110 are transparent glass plates like the ones manufactured and sold by Corning Incorporated under the brand names of Code 1737 glass or Eagle 2000™ glass. Alternatively, the cover and substrate plates 102 and 110 can be any transparent glass plates like for example the ones manufactured and sold by Asahi Glass Co. (e.g., OA10 glass and OA21 glass), Nippon Electric Glass Co., NHTechno and Samsung Corning Precision Glass Co.

At step 206, the frit 108 is deposited near the edges of the cover plate 102. For example, the frit 108 can be placed approximately 1 mm away from the free edges of the cover plate 102. In the preferred embodiment, the frit 108 is a low temperature glass frit that contains one or more absorbing ions chosen from the group including iron, copper, vanadium, and neodymium (for example). The frit 108 may also be doped with a filler (e.g., inversion filler, additive filler) which lowers the coefficient of thermal expansion of the frit 108 so that it matches or substantially matches the coefficient of thermal expansions of the two glass plates 102 and 110. For a more detailed description about the compositions of some exemplary frits 108 that can be used in this application reference is made to U.S. patent application Ser. No. 10/823,331 entitled "Glass Package that is Hermetically Sealed with a Frit and Method of Fabrication". The contents of this document are incorporated by reference herein.

In addition, the frit 108 can be pre-sintered to the cover plate 102. To accomplish this, the frit 108 which was deposited onto the cover plate 102 is heated so that it becomes attached to the cover plate 102. A more detailed discussion about how one can pre-sinter the frit 108 to the cover plate 102 is provided below in the text just prior to the description associated with FIG. 11.

At step 208, the OLEDs 104 and other circuitry including the electrodes 106 are deposited onto the substrate plate 110. The typical OLED 104 includes one or more organic layers (not shown) and anode/cathode electrodes 106. However, it should be readily appreciated by those skilled in the art that any known OLED 104 or future OLED 104 can be used in the OLED display 100. In addition, it should be appreciated that another type of thin film device can be deposited in this step besides the OLEDs 104 if an OLED display 100 is not being made but instead another glass package like one used in an optical sensor is going to be made using the sealing technique(s) of the present invention.

At step 210, the sealing apparatus 114 (e.g., laser 114) heats the frit 108 using one or more of the sealing techniques of the present invention such that a substantially constant temperature is maintained in the frit 108 along the sealing line 116 while the frit 108 melts and forms the hermetic seal 112 which connects and bonds the cover plate 102 to the substrate plate 110 (see FIG. 1B). The hermetic seal 112 also protects the OLEDs 104 by preventing oxygen and moisture in the ambient environment from entering into the OLED display 100.

The sealing techniques of the present invention enable the sealing apparatus 114 to maintain a constant temperature on the frit line 116 during the sealing process even though there are electrodes 106 that have different patterns and properties that pass under the frit 108 which melts and forms the hermetic seal 112. However, to accomplish this the sealing techniques need to take into account several factors which can affect the rate of the heat diffusion and in turn the temperature of the frit 108 at the sealing point 116. First, the typical frit 108 transmission can vary from 2% to 30% depending on its composition and thickness. Secondly, the electrodes 106 depending on their composition can absorb or reflect the light, transmitted through the frit 108. Thirdly, the thermal conductivity of the substrate plate 110 with and without deposited electrodes 106 often varies which affects the rate of the heat diffusion at the sealing point 116. In general, the temperature rise (T frit) in the frit 108 at any point along the sealing line 116 can be estimated as follows:

$$Tfrit \sim P/a^2 sqrt(vD)(\epsilon(frit)+(1-\epsilon(frit)e(\text{electrode})+(1-\epsilon frit)R(\text{electrode})\epsilon(frit))$$

where Tfrit is temperature rise in the frit 108, P is laser power of the laser 114, v is laser translation speed, a is the laser spot size, D is heat diffusivity in the substrate plate 110, ϵ (frit) is percentage of the laser power absorbed by frit 108 on the first path, R(electrode) is reflectivity of the electrode 108 and e(electrode) is the percentage of laser power absorbed by electrode 108.

Figure 3:
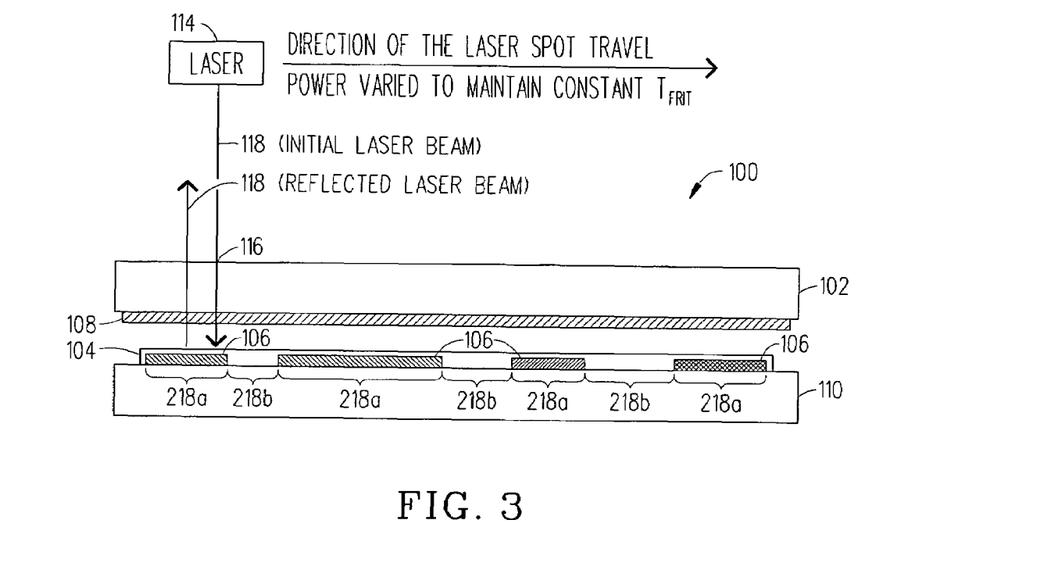
FIG. 3 is a cross-sectional side view of an OLED display being hermetically sealed by a first sealing technique in accordance with the present invention.

As can be seen, this equation represents an amount of energy absorbed by frit 108 on the first path, the amount of the laser energy transmitted through frit 108 and absorbed by the electrode 106, and the amount of the laser energy transmitted through the frit 108, reflected from the electrode 106 and absorbed by frit 108 on the second path (e.g., see FIG. 3). Even though the equation is valid for semi-infinite volume heating it may not be exact to represent T(frit) dependence on the v (velocity) and K (thermal conductivity) but this equation does show the qualitative dependence of T(frit) on the values of these parameters. The equation also makes it clear that during the sealing process the temperature rise in the frit 108 can be made equal for the electrode-free regions and the electrode occupied regions along the sealing line 116. The different sealing techniques that can ensure the sealing apparatus 114 uniformly heats the frit 108 along the sealing line 116 which has electrode-free regions and electrode occupied regions are described in detail below with respect to FIGS. 3-10.

Referring to FIG. 3, there is a cross-sectional side view of the OLED display 100 being hermetically sealed by one of the sealing techniques in accordance with the present invention. In this embodiment, the sealing technique is one where the laser 114 needs to dynamically change the power of the laser beam 108 at different points on the sealing line 116 to maintain a substantially constant temperature in the frit 108 along the sealing line 116 that has electrode occupied regions 218a and electrode free regions 218b. In particular, the laser 114 maintains a constant temperature in the frit 108 on the sealing line 116 by lowering the power of the laser beam 118 when the electrode occupied regions 218a are present on the sealing line 116 and by increasing the power of the laser beam 118 when the electrode free regions 218b are present on the sealing line 116.

Figure 4A:
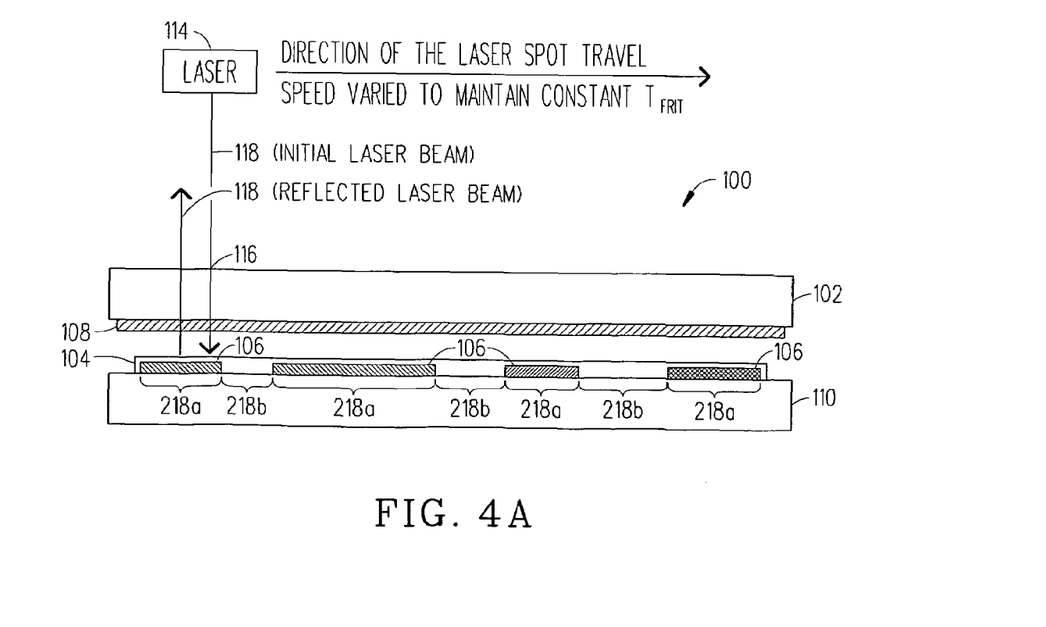
FIGS. 4A-4C are three diagrams that are used to help describe a second sealing technique that can be used to hermetically seal an OLED display in accordance with the present invention.
Figure 4B:
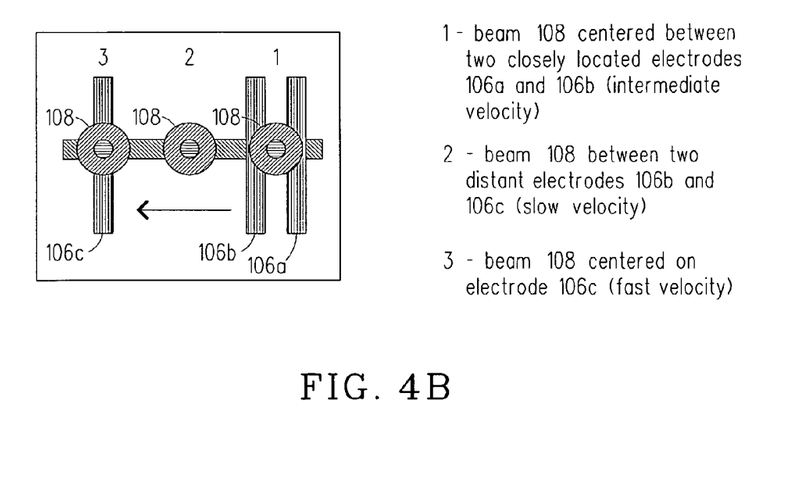
Figure 4C:
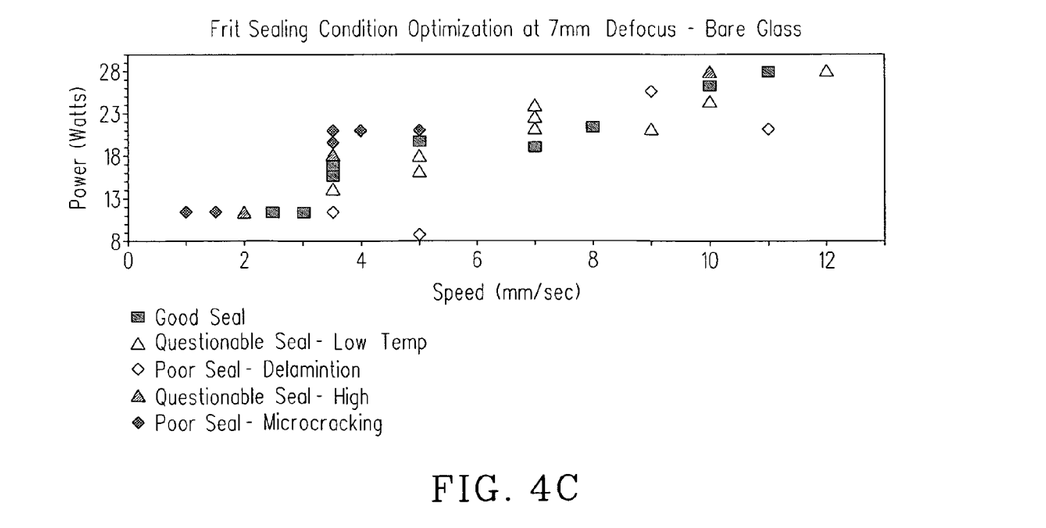

Referring to FIG. 4A, there is a diagram which is used to help describe a second sealing technique that can be used to hermetically seal an OLED display in accordance with the present invention. In this embodiment, the sealing technique used is one where the laser 114 dynamically changes the speed (v) of the laser beam 108 to maintain a substantially constant temperature in the frit 108 along the sealing line 116 that has electrode occupied regions 218a and electrode free regions 218b. For instance, the laser 114 can maintain a constant temperature in the frit 108 on the sealing line 116 by moving the laser beam 118 faster when it is over the electrode occupied regions 218a and by moving laser beam 118 slower when it is over electrode free regions 218b. In fact, the laser 114 may move the laser beam 118 at a third intermediate speed in the areas where there are electrodes 106 in close proximity to the sealing line 116. This process which is also shown in FIG. 4B can be implemented regardless of whether the electrodes 106 are highly absorptive and/or highly reflective. Alternatively, instead of moving the laser 114 over a stationary OLED display 100, a stage/support (not shown) which holds the OLED display 100 could be moved at different speeds under a stationary laser 114 to maintain a constant temperature within the frit 108. FIG. 4C is a graph illustrating some experimental results that were obtained when two bare glass plates with no electrodes were sealed together using this sealing technique.

Figure 5:
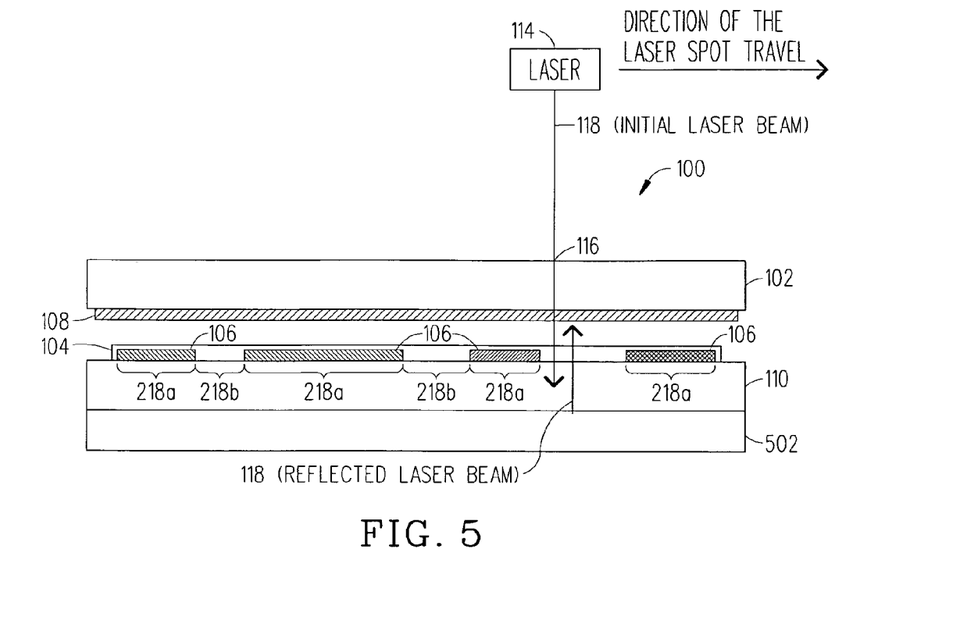
FIG. 5 is a cross-sectional side view of an OLED display being hermetically sealed by a third sealing technique in accordance with the present invention.

Referring to FIG. 5, there is a cross-sectional side view of the OLED display 100 being hermetically sealed by yet another one of the sealing techniques in accordance with the present invention. In this embodiment, the sealing technique is one where a high reflector 502 (e.g., mirror 502) is placed under the substrate plate 110 while the laser 114 emits the laser beam 118 to melt the frit 108 and form the hermetic seal 112. The high reflector 502 helps to balance the power absorbed by the frit 108 regardless of whether the frit 108 is located over electrode occupied regions 218a or electrode free regions 218b. For example, the temperature rise in the frit 108 at different points along the sealing line 116 can be represented as follows:

At the electrode occupied regions 218a:

$$T(frit)1 = P/a^2 sqrt(vD)(\epsilon(frit)+(1-\epsilon(frit)e(\text{electrode})+(1\epsilon frit)R(\text{electrode})\epsilon(frit))$$

And, at the electrode free regions 218b

$$T(frit)2 = P/a^2 sqrt(vD)(\epsilon(frit)+(1-\epsilon(frit))*R(\text{reflector})*\epsilon(frit))$$

As can be seen, it is possible to decrease the difference T(frit)1−T(frit)2 by using the high reflector 502. The difference would depend on the optical parameters and properties of the electrodes 106. It should be appreciated that in this sealing technique, the power and/or speed of the laser beam 118 can be maintained at a constant or dynamically changed.

Figure 6:
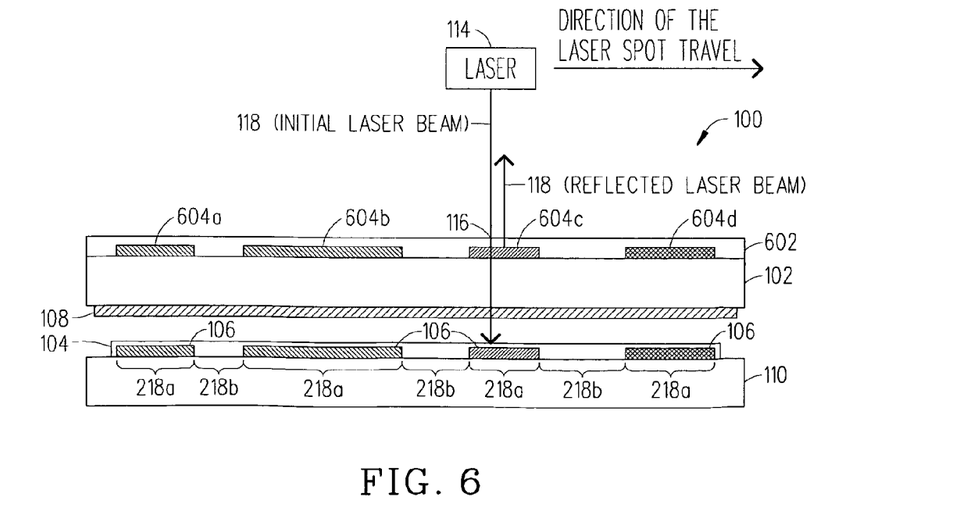
FIG. 6 is a cross-sectional side view of an OLED display being hermetically sealed by a fourth sealing technique in accordance with the present invention.

Referring to FIG. 6, there is a cross-sectional side view of the OLED display 100 being hermetically sealed by yet another one of the sealing techniques in accordance with the present invention. In this embodiment, the sealing technique is one where a partially reflective mask 602 is placed on top of the cover plate 102 while the laser 114 emits the laser beam 118 to melt and form the hermetic seal 112. The partially reflective mask 602 has different patterns 604a, 604b . . . 604d that represent different reflectivities of the mask 602 to compensate for the different properties of electrodes 106. In this way, the partially reflective mask 602 helps to balance the power absorbed by the frit 108 regardless of whether the frit 108 is located over electrode occupied regions 218a or electrode free regions 218b.

Figure 7:
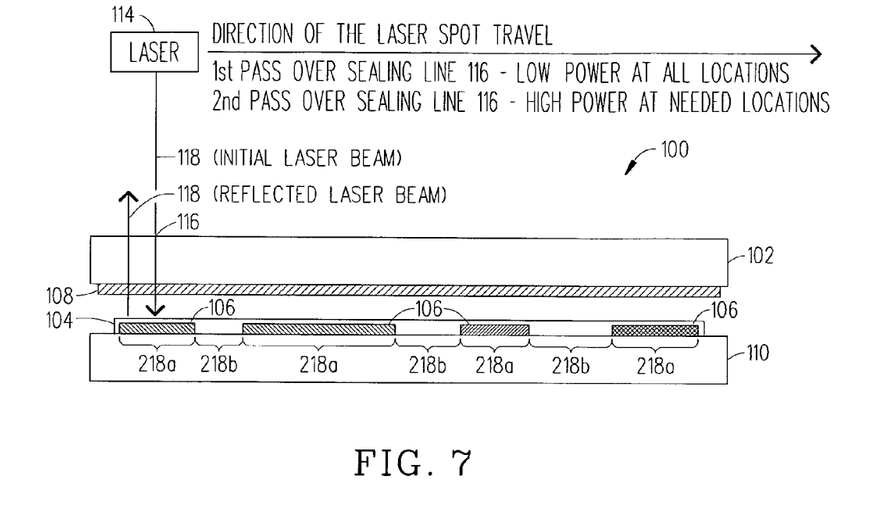
FIG. 7 is a cross-sectional side view of an OLED display being hermetically sealed by a fifth sealing technique in accordance with the present invention.

Referring to FIG. 7, there is a cross-sectional side view of the OLED display 100 being hermetically sealed by yet another one of the sealing techniques in accordance with the present invention. In this embodiment, the sealing technique is one where the laser 114 seals at least a part of the frit line 116 in a first pass at the lowest power corresponding to the right sealing temperature along the line 116 and then finishes the sealing of the line 116 in a second pass at a higher power only at places which failed to reach the correct temperature during the first pass. A feedback mechanism similar to or like the one described below may be used if needed to determine which sections of the frit 108 did not reach the correct temperature during the first pass.

Figure 8:
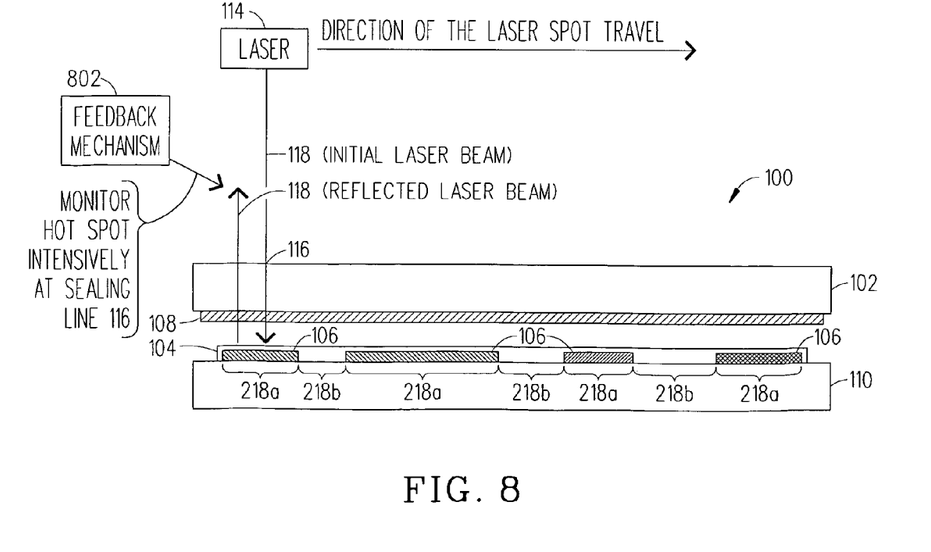
FIG. 8 is a cross-sectional side view of an OLED display being hermetically sealed by a sixth sealing technique in accordance with the present invention.

Referring to FIG. 8, there is a cross-sectional side view of the OLED display 100 being hermetically sealed by yet another one of the sealing techniques in accordance with the present invention. In this embodiment, the sealing technique is one that uses a feedback mechanism 802 to help ensure there is uniform heating within the frit 108 along the sealing line 116 during the formation of the hermetic seal 112. The feedback mechanism 802 can be used to monitor the hot spot intensity of the sealing line 116 at a certain fixed wavelength. The hot spot originates from black body emission due to the temperature rise along the sealing line 116 because of the heating by the laser 114. The emission spectrum is very broad and almost any of the wavelengths from 500-2000 nm could be used for this purpose. In one embodiment, the feedback mechanism 100 monitors the on-line emission intensity, converts it to a temperature and optimizes one or more sealing parameters to ensure the temperature is uniform along the sealing line 116 regardless of whether the frit 108 is over electrode occupied regions 218a or over electrode free regions 218b. For instance, the feedback mechanism 802 can control the power of the laser 114 to make the temperature uniform along the sealing line 116 regardless of whether the frit 108 is over the electrode occupied regions 218a or electrode free regions 218b. There are many different ways one can use the feedback mechanism 802 some of which are described below:

The feedback mechanism 100 can monitor the temperature at different locations on the sealing line 116 while the laser 114 seals an unknown sample OLED display 100. The feedback mechanism 100 modifies the laser speed or power at certain locations along the sealing line 116 in order to keep the temperature constant within the frit 108 while sealing the sample OLED display 100. The laser 114 can then apply these conditions to seal similar OLED displays 100.

The feedback mechanism 100 can "actively" monitor the temperature at different locations on the sealing line 116 while the laser 114 seals the OLED display 100. The feedback mechanism 100 also modifies the laser speed or power at certain locations along the sealing line 116 to keep the temperature constant within the frit 108 while sealing the OLED display 100.

Figure 9A:
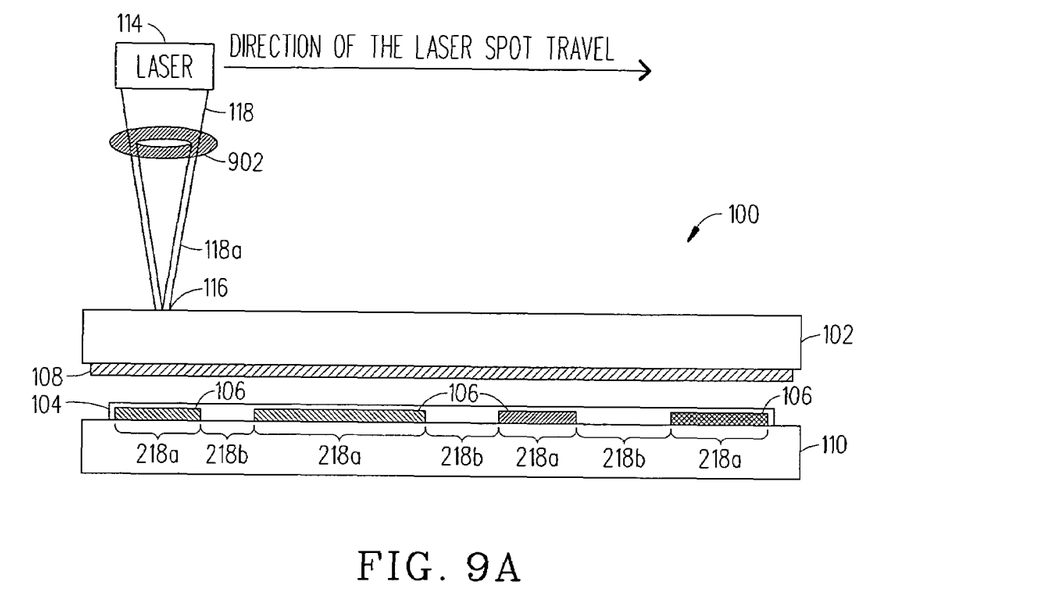
FIGS. 9A-9C are three diagrams that are used to help describe a seventh sealing technique that can be used to hermetically seal an OLED display in accordance with the present invention.
Figure 9B:
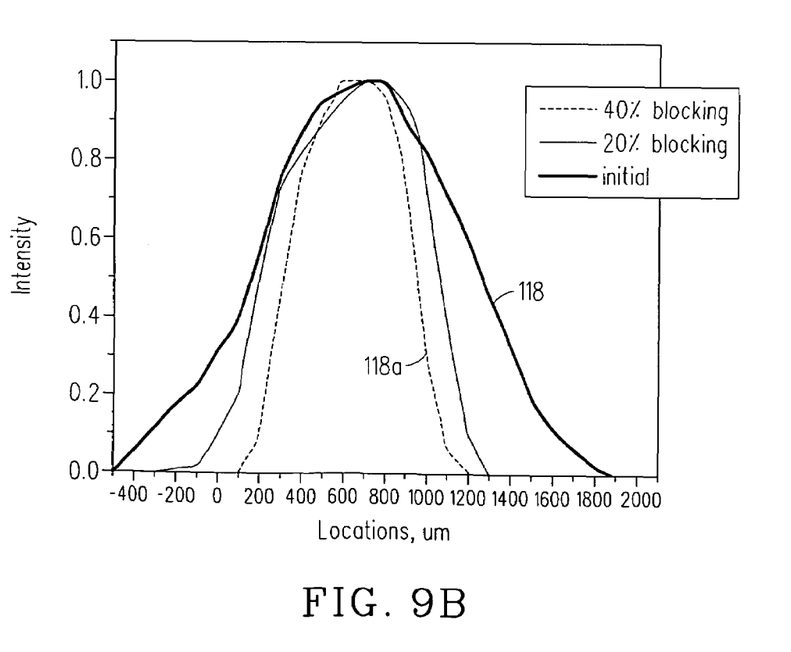
Figure 9C:
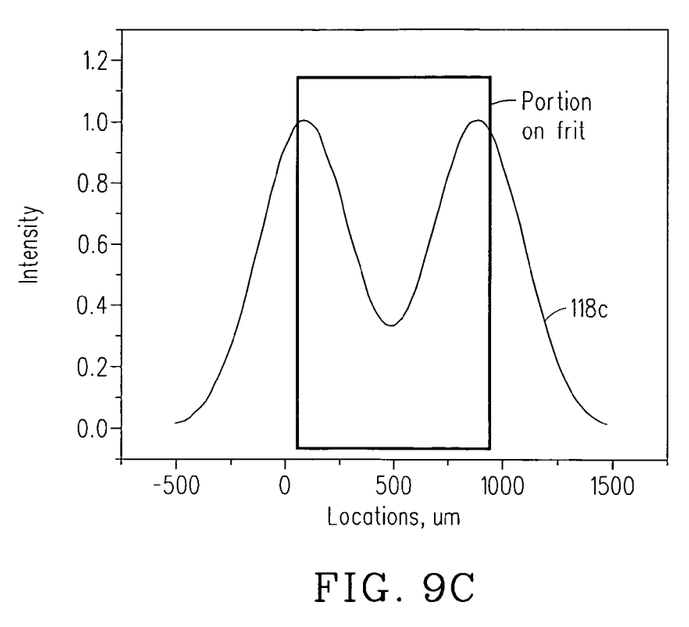
Figure 10:
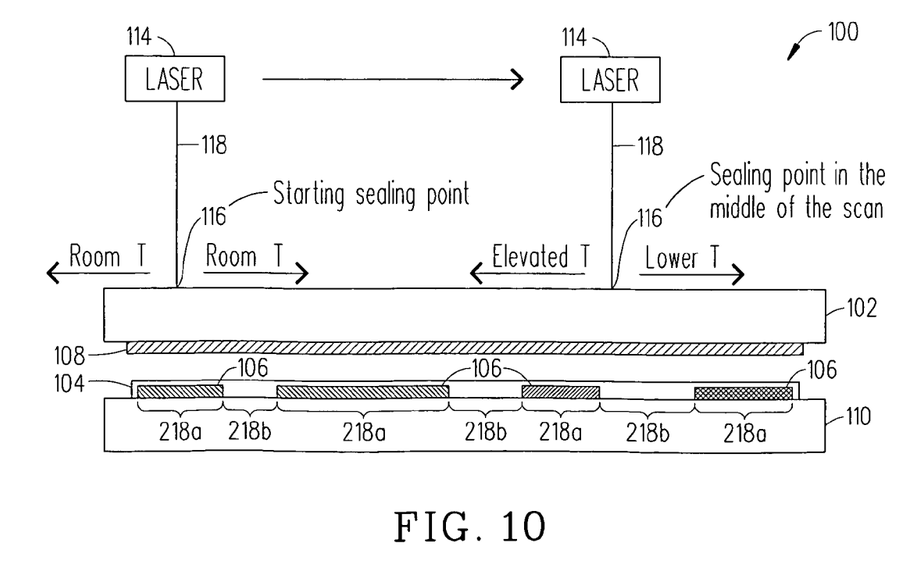
FIG. 10 is a cross-sectional side view of an OLED display which is used to show that each of of the aforementioned sealing techniques may have to take into account the starting temperature and subsequent temperatures of the frit while manufacturing the hermitically sealed OLED display in accordance with the present invention.

Referring to FIGS. 9A-9C, there are different views illustrating how the laser 114 can be used to hermetically seal the OLED display 100 using yet another sealing technique in accordance with the present invention. In this embodiment, the sealing technique is one where the beam profile of the laser beam 118 is modified by a circular aperture 902 located at the end of the laser 114 (see FIG. 9A). The circular aperture 902 is sized to modify the laser beam 118 by blocking/defocusing a portion of that beam 118 such that a modified laser beam 118a that heats the frit 108 along the sealing line 116 of the OLED display 100 (see FIG. 9B). As can be seen in the graph shown in FIG. 9B, the circular aperture 902 modifies the gaussian shape of the laser beam 118 by clipping its tails. The defocused laser beam 118a also has a reduced 1/e power level that can provide the needed coverage and needed power at the sealing line 116 while at the same time not to expose any of the devices (e.g., OLEDs 104) outside of the frit line 116 to extra heat generation which can permanently damage of the OLDE display 100. In an alternative embodiment, the circular aperture 902 can have a blocking circle (not shown) located in the middle thereof to further change the shape of the laser beam 118 (see FIG. 9C). As can be seen in the graph shown in FIG. 9C, the modified laser beam 118c has a shape that helps make the temperature uniform over the frit 108 which typically has more heat diffusion at its edges. An elliptical beam 118 causes uniform heating across the frit 108 and also enables gradual heating and cooling along the frit 108, which helps to reduce residual stress.

It should be appreciated that more than one of the aforementioned sealing techniques can be used at the same time to form the hermetic seal 112 in the OLED display 100. For instance, the OLED display 100 can be sealed by using the sealing techniques described above with respect to changing the power of the laser 114 (see FIG. 3) and with using the circular aperture 902 to modify the shape of the laser beam 118 (see FIGS. 9A-9C).

Moreover, it should be appreciated that in the sealing process the starting point for sealing the frit 108 typically has a lower temperature than the remaining parts of the frit 108 that are located further down on the sealing line 116. This is due to the fact that the frit 108 at the starting point is at room temperature while the rest of the frit 108 has an elevated temperature during the formation of the hermetic seal 112 (see FIG. 10). This means that sealing parameters of the laser 114 (for example) at the beginning of the frit 108 may need to be adjusted to take into account the differences in the surrounding temperatures.

The technique that is described next can be used to increase the sealing speed of the laser 114 which could help improve the efficiency of any of the aforementioned sealing techniques. If a round laser spot is used then the maximum sealing speed would be in the range of ~10-11 mm/s. However, if one used an elliptical or slit like shaped laser beam 118 to heat the frit 108, then this would likely result in increasing the speed one could use to seal the OLED display 100 provided that the power density of the elliptical shaped laser beam 118 is the same as the round shaped laser beam 118. In other words, the power of the laser 114 needs to be increased proportionally as the spot area of the elliptical shaped laser beam 118 increases relative to a round shaped laser beam 118. All of this would enable one to speed-up the sealing process by the ratio of the length to the width of the spot size of the elliptical shaped laser beam 118. However, special care may be needed to take care of the corners in the OLED display 100 where the speed of the elliptical shaped laser beam 118 needs to go back to a slow regime (the same as for round beam). Alternatively, one may need to rotate the elliptical shaped laser beam 118 while the laser 114 is located over the corners of the OLED display 100 to properly seal the OLED display 100.

Described below are some different ways one could hermetically seal a LCD-type glass (e.g. codes 1737 and Eagle$^{2000}$) to an organic light emitting device (OLED) substrate using the aforementioned sealing techniques. For instance, the frit 108 can be applied to the LCD glass plate 102 by screen-printing or by a programmable auger robot which provides a well-shaped pattern. Then, the LCD glass sample 102 with the frit pattern located thereon can be placed in a furnace which "fires" the frit 108 at a temperature that depends on the composition of the frit 108. Again, the frit 108 can contain one or more of the transition elements (vanadium, iron, nickel, etc.) that have a substantial absorption cross-section at 810 nm (for example) which matches the operating wavelength of an 810 nm laser 114 (for example). During this heating, the frit 108 is pre-sintered and the organic binder mostly burns out. This step can be important because, otherwise, the organics from the frit 108 could evaporate and then precipitate inside the OLED display 100 during laser sealing.

After the frit 108 is pre-sintered, it can be ground so that the height variation does not exceed 2-4 μm with a target height of 12-15 um. If the height variation is larger, the gap may not close when the frit 108 melts during laser sealing or the gap may introduce stresses which can crack the substrates 102 and 110. Frit 108 height is an important variable which allows the plates 102 and 110 to be sealed from the backside. What this means is that the laser beam 118 can first traverse the cover plate 102 that has the pre-sintered frit 108.

If the frit 108 is too thin it does not leave enough material to absorb the laser irradiation resulting in failure. If the frit 108 is too thick it will be able to absorb enough energy at the first surface to melt, but will shield the necessary energy needed to melt at the secondary surface on plate 110. This usually results in poor or spotty bonding of the two glass substrates 102 and 110.

After the pre-sintered frit 108 is ground, the cover plate 102 could go through a mild ultrasonic cleaning environment to remove any debris that has accumulated to this point. The typical solutions used here can be considerably milder than the ones used for cleaning display glass which has no additional deposition. During cleaning, the temperature can be kept lower to avoid degradation of deposited frit 108.

After cleaning, a final processing step can be performed to remove residual moisture. The pre-sintered cover plate 102 can be placed in a vacuum oven at a temperature of 100° C. for 6 or more hours. After removal from the oven the pre-sintered cover plate 102 can be placed in a clean room box to deter dust and debris from accumulating on it before performing the sealing process.

The sealing process includes placing the cover plate 102 with a frit 108 on top of another glass plate 110 with OLEDs/electrodes 104 and 106 located on top in such a manner that the frit 108 and OLEDs/electrodes 104 and 106 are sandwiched between the two glass plates 102 and 110. Mild pressure can be applied to the glass plates 102 and 110 to keep them in contact during the sealing process. The laser 114 focuses its beam 118 on the frit 108 through the cover plate 102. The laser beam 118 can then be defocused to approximately 3.5 mm spot size to make the temperature gradient more gradual. The frit 108 needs a warm up and anneal phase before melting. I{n addition the pre-sintered cover plate should be stored in an inert atmosphere to prevent re-adsorption of $O_2$ and $H_2O$ before melting. The velocity of travel of the laser 114 to the frit pattern can range between 0.5 mm/s and 15 mm/s depending on the set parameters. Faster travel velocities would generally require more current to the diode laser 114. For example, one could seal at velocities in the range of 0.5 and 2 mm/s with laser power in the range of 9 and 12 Watts. The power necessary varies depending on the absorption coefficient and thickness of the frit 108. The necessary power is also affected if a reflective or absorbent layer is placed underneath the substrate plate 110 such as certain lead materials 502 (e.g., see FIG. 5). It is also believed that a faster sealing regime can occur if power density per unit time is increased. As described above, the frit 108 can vary depending on the homogeneity of the frit along with the filler particle size. And, if the frit 108 does have filler particles that absorb the near IR wavelengths, then the frit 108 is somewhat transparent. This can adversely affect the way the frit absorbs and consequently melts to the display substrates 102 and 110.

Figure 11:
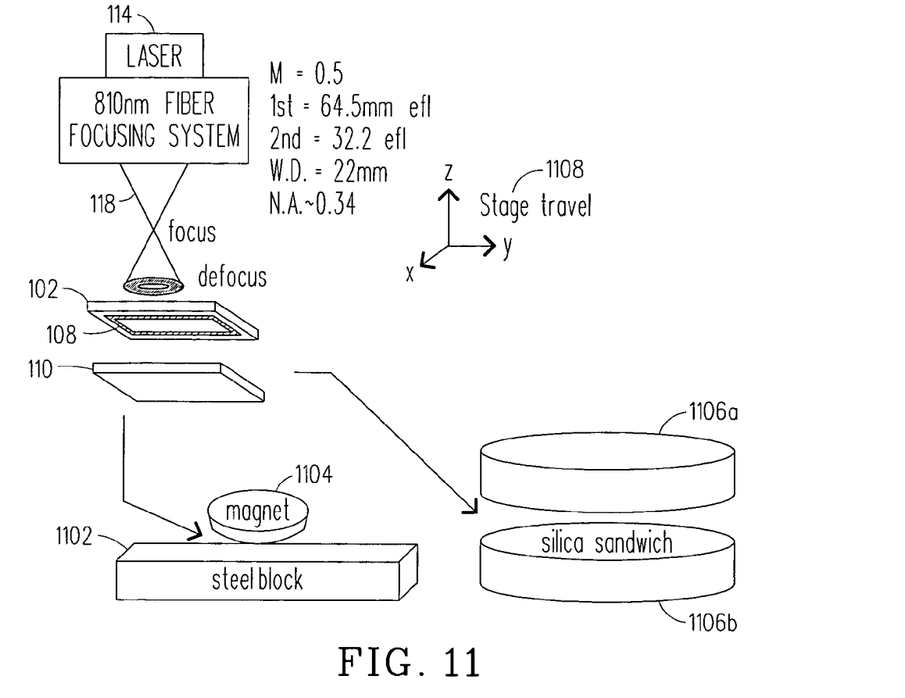
FIG. 11-13 are several diagrams used to help describe some exemplary ways one could manufacture an OLED display using one or more of the aforementioned sealing techniques in accordance with the present invention.

FIG. 11 illustrates the concept of how the plates 102 and 110 are placed in reference to the laser 114. Specifications of an exemplary lens system are included but are not a requirement for delivery of energy from the laser 114. Again, the laser beam 118 can be defocused to reduce the temperature gradient as the frit 108 is traversed by the laser 114. It should be noted that if the gradient is too steep (focus is too tight) that the OLED display 100 may exhibit violent cracking resulting in immediate failure.

There are two exemplary strategies shown in FIG. 11 that can be used to hold the cover plate 102 in close contact with the glass plate 110. The first approach is one where the plates 102 and 110 are placed on a steel block 1102 with a magnet 1104 on top of the plates 102 and 110. The other approach is to place the display plates 102 and 110 between two clear silica discs 1106a and 1106b with low scratch/dig and extremely high flatness. These silica discs 1106a and 1106b can then be clamped in a variety of methods and are transparent to the near infrared irradiation. If the discs 1106a and 1106b are flat and extremely stiff, then relatively thin display sheets 102 and 110 can adhere to their shape maintaining flatness and direct contact with each other.

Figure 12:
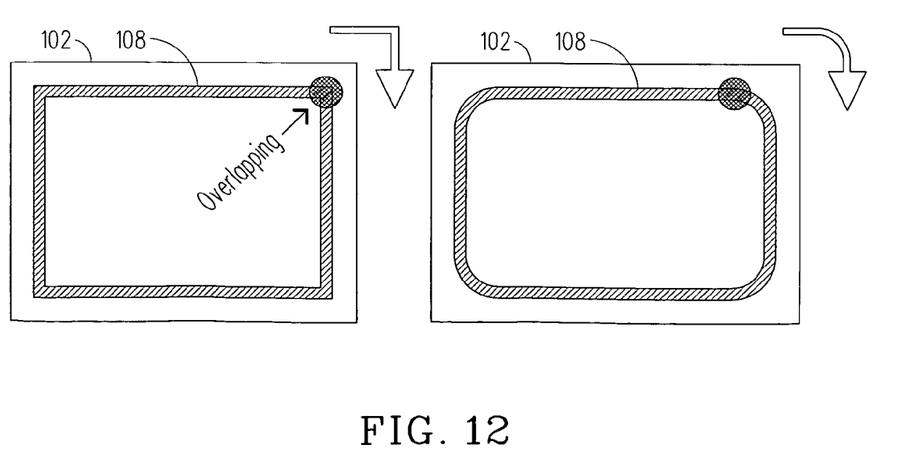

The motion of a stage 108 which holds the plates 102 and 110 can be controlled by a computer (not shown) which runs programs written to trace the frit 108 that has been dispensed onto the display glass 102. Most frit 108 patterns are rectangular in shape and have rounded corners. The radius of curvatures for the corners range between 0.5 mm and 4 mm and are necessary to reduce overheating in this area. Overheating can occur as the travel motion in the x direction is reduced while the y direction is increased and vice versa. If the defocus sealing beam 118 is approximately 3.5 mm, then there will likely be additional heating for a completely square corner. To negate this effect of overheating, velocity, power, or radius of the laser beam 118 can be adjusted. For example, this effect can be overcome solely by keeping a radius of curvature larger than the overlap of the defocus laser beam 118. This is shown in FIG. 12.

Because the frit 108 is to some degree transparent, any layer like the electrodes 106 that resides under it, that are reflective, will create an additional heat source because the laser beam 118 reflects back into the frit 108. It is not a double dose but substantially more than what is intended. Also, some of these electrodes 106 can be absorptive in the near IR which means they can have some substantial heating when irradiated by the laser source 114. When the electrodes 106 exhibit both properties, it creates a very difficult effect to overcome with a sealing regime. This effect is labeled as a power density per unit time. Because electrodes 106 are scattered and placed indeterminately of where the frit 108 is to be placed, it is necessary to manage the power density issue. As described above with the aforementioned sealing techniques of the present invention, there are several ways to manage this issue:

One approach is to change the current to the diode laser 114 by decreasing the current where the electrodes 106 are and restoring it where they are not (see FIG. 3).

Another approach is to change translation speed to accommodate over heating by increasing velocity where the electrodes 106 are present and reducing velocity where the electrodes 106 are not. It was first determined that there would be two individual velocities necessary to accomplish this, however, a third intermediate velocity may be needed for those areas where there are electrodes 106 in close proximity to the path of the frit 108. This is most likely due to the overlap of the defocusing of the laser beam 118 (see FIGS. 4A, 4B and 12).

Yet another approach is to place a highly reflective front surface mirror 502 or create a mirror surface on the steel block 1102 in an effort to make the entire lower lying body reflective. This may eliminate large fluctuations in the power density as the beam 118 traverses these different layers (see FIG. 5).

Still yet another approach is to place a mask over the display glass 102 which will reduce the excess light that comes from defocusing the laser beam 118. Also, a reflective mask would prevent undesirable laser light from reaching electrodes, drivers and electroluminescence (EL) materials.

Figure 13:
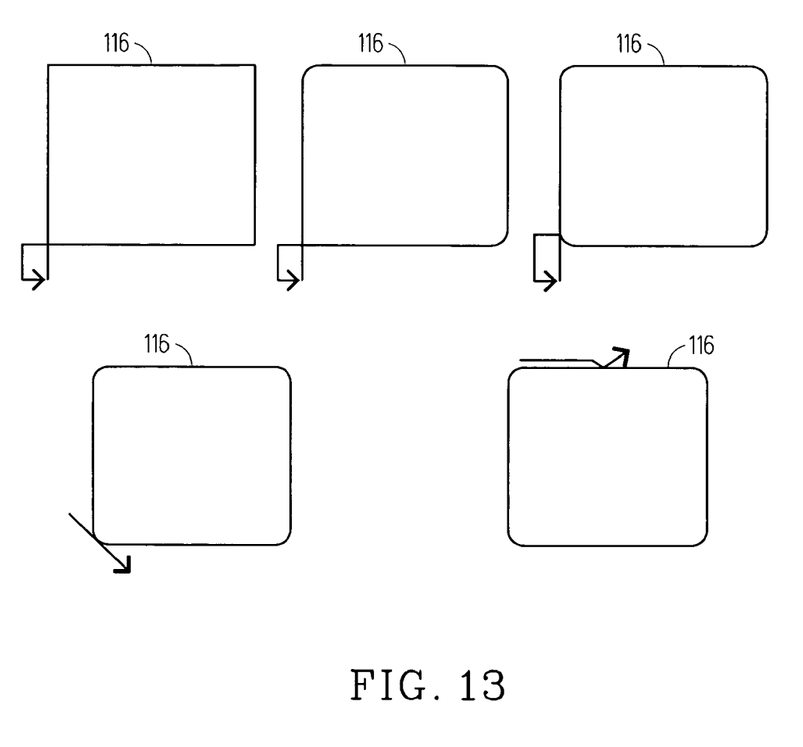

The idea of managing the power density of the laser 114 during the sealing process first arose when attempts were made to seal glass plates 102 and 110 which contained molybdenum in their major bus lines and electrodes. Molybdenum has characteristics of being both absorptive and reflective for the near IR. For this reason it was apparent immediately upon sealing that the sample was going to either over heat and crack, or the frit would not melt and seal hermetically at all, unless the power density was managed. As described above, one way to control power density during the sealing process is to vary the speed of translation of the laser beam 118. In some experiments, three speeds were used to complete the loop around the plates 102 and 110. The slowest speed can be used where there was no electrode(s) 106 are located in the seal path 116 or adjacent to the seal path 116. The fastest speed can be used where electrode(s) 106 located in the seal path 116 or adjacent to the seal path 116. An intermediate speed can be used speed when the frit 108 pattern covered is between electrodes 106 or is over a material that is slightly reflective or adjacent to these materials. FIG. 13 illustrates several different sealing paths 116 that can be traversed by the laser beam 118 to create the OLED display 100.

Following are some of the different advantages and features of the present invention:

It should be appreciated that any of the aforementioned sealing techniques can be used to seal two glass sheets together without the aid of a frit. In this embodiment, one of the glass sheets may be doped with the same material used to dope the frit if needed.

The hermetic seal 112 has the following properties:
Good thermal expansion match to glass plates 102 and 110.
Low softening temperature.
Good chemical and water durability.
Good bonding to glass plates 102 and 110.
Good bonding to metal leads 106 (e.g., anode and cathode electrodes 106).
Dense with very low porosity.

It is important to understand that other types of glass plates 102 and 110 besides the Code 1737 glass plates and EAGLE 2000™ glass plates can be sealed to one another using the sealing techniques of the present invention. For example, glass plates 102 and 110 made by companies like Asahi Glass Co. (e.g., OA10 glass and OA21 glass), Nippon Electric Glass Co., NHTechno and Samsung Corning Precision Glass Co. can be sealed to one another using the sealing techniques of the present invention.

There are other considerations which should also be taken into account in the present invention like making sure there is a right match between the CTEs of the sealed glasses 102 and 110 and frit 108. And, making sure there is a right match between the viscosities (e.g., strain, softening points) of the sealed glasses 102 and 110 and frit 108.

It should be noted that the frit 108 that is pre-sintered to the cover plate 102 in accordance with step 206 can be sold as a unit to manufacturers of the OLED display 100 who can then install the OLEDs 104 and perform the final manufacturing step 208 at their facility using a localized heat source.

The OLED display 100 can be an active OLED display 100 or a passive OLED display 100.

Although the electrodes 106 are described above as being non-transparent, it should be understood that the electrodes 106 can be either reflective, absorptive, transmissive or any combination thereof. For example, ITO electrodes 106 can transmit more than they reflect or absorb.

It should be noted that another aspect of the present invention is to control the cooling rate of the OLED display 100 after completing the heating step 208. Abrupt and rapid cooling may cause large thermal strains leading to high elastic thermal stresses on the hermetic seal 112 and the sealed plates 102 and 110. It should also be noted that the suitable cooling rate depends on the size of the particular OLED display 100 to be sealed and the heat dissipation rate to the environment from the OLED display 100.

Although several embodiments of the present invention has been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A method for manufacturing an optical device, said method comprising the steps of:
providing a cover plate;
providing a substrate plate;
depositing a fit onto said cover plate;
depositing at least one thin film device onto said substrate plate; and
using a sealing apparatus to heat said frit in a manner where a substantially constant temperature is maintained in said flit along a sealing line that has regions free of electrodes and regions occupied by electrodes which are connected to said at least one thin film device and where said frit melts and forms a hermetic seal that connects said cover plate to said substrate plate and also protects said at least one thin film device located between said cover plate and said substrate plate.

2. The method of claim 1, further comprising the step of pre-sintering said frit to said cover plate.

3. The method of claim 1, wherein said frit is glass doped with a material that is absorbent at a specific wavelength of light.

4. The method of claim 1, wherein said electrodes are metal non-transparent electrodes that have different patterns and different optical properties.

5. The method of claim 1, wherein said electrodes are reflective, absorptive, transmissive or any combination thereof.

6. The method of claim 1, wherein said sealing apparatus emits a laser beam used to melt said frit where a speed of the laser beam is dynamically changed in a manner that maintains the substantially constant temperature in said frit along the sealing line which has the electrode free regions and the electrode occupied regions.

7. The method of claim 1, wherein said sealing apparatus dynamically changes a power of a laser beam used to melt said frit in a manner that maintains the substantially constant temperature in said frit along the sealing line which has the electrode free regions and the electrode occupied regions.

8. The method of claim 1, wherein a reflector is placed under said substrate while said sealing apparatus emits a laser beam through said cover plate to melt said frit in a manner that maintains the substantially constant temperature in said frit along the sealing line which has the electrode free regions and the electrode occupied regions.

9. The method of claim 1, wherein a partially reflective mask is placed on top of said cover plate while said sealing apparatus emits a laser beam through said partially reflective mask and said cover plate to melt said frit in a manner that maintains the substantially constant temperature in said frit along the sealing line which has the electrode free regions and the electrode occupied regions.

10. The method of claim 1, wherein said sealing apparatus emits a lower power laser beam used to melt said frit along the sealing line during a first pass and then said sealing apparatus emits a higher power laser beam during a second pass only at portions of said frit along the sealing line which did not reach a correct temperature during the first pass of said lower power laser beam.

11. The method of claim 1, wherein said sealing apparatus uses an elliptical focusing lens to emit an elliptical shaped laser beam to melt said frit in a manner that maintains the substantially constant temperature in said frit along the sealing line which has the electrode free regions and the electrode occupied regions.

12. The method of claim 1, wherein said sealing apparatus uses a focusing lens and a specially shaped aperture to emit a defocused laser beam to melt said frit in a manner that maintains the substantially constant temperature in said frit along the sealing line which has the electrode free regions and the electrode occupied regions.

13. The method of claim 1, wherein a feedback mechanism is used to optimize an operation of said sealing apparatus so as to melt said frit in a manner that maintains the substantially constant temperature in said frit along the sealing line which has the electrode free regions and the electrode occupied regions.

14. The method of claim 1, wherein a mask is placed on top of said cover plate while said sealing apparatus emits a laser beam through a slit in said mask and said cover plate to melt said frit in a manner that maintains the substantially constant temperature in said frit along the sealing line which has the electrode free regions and the electrode occupied regions.

15. A method for manufacturing a glass package, said method comprising the steps of:
providing a cover plate;
providing a substrate plate;
depositing at least one thin film device onto said substrate plate; and
using a sealing apparatus to heat a portion of said substrate plate in a manner where a substantially constant temperature was maintained in the portion along a sealing line that has regions free of electrodes and regions occupied by electrodes which are connected to said at least one thin film device and where said portion melts and forms a hermetic seal that connects said cover plate to said substrate plate and also protects said at least one thin film device located between said cover plate and said substrate plate.

16. The method of claim 15, wherein said substrate plate is glass doped with a material that is absorbent at a specific wavelength of light.

17. The method of claim 15, wherein said electrodes are metal non-transparent electrodes that have different patterns and different optical properties.

18. The method of claim 15, wherein said electrodes are reflective, absorptive, transmissive or any combination thereof.

19. The method of claim 15, wherein said sealing apparatus emits a laser beam used to melt said portion of said substrate plate where a speed of the laser beam is dynamically changed in a manner that maintains the substantially constant temperature in said portion of said substrate plate along the sealing line which has the electrode free regions and the electrode occupied regions.

20. The method of claim 15, wherein said sealing apparatus dynamically changes a power of a laser beam used to melt said portion of said substrate plate in a manner that maintains the substantially constant temperature in said portion of said substrate plate along the sealing line which has the electrode free regions and the electrode occupied regions.

21. The method of claim 15, wherein a reflector is placed under said substrate while said sealing apparatus emits a laser beam through said cover plate to melt said portion of said substrate plate in a manner that maintains the substantially constant temperature in said portion of said substrate plate along the sealing line which has the electrode free regions and the electrode occupied regions.

22. The method of claim 15, wherein a partially reflective mask is placed on top of said cover plate while said sealing apparatus emits a laser beam through said partially reflective mask and said cover plate to melt said portion of said substrate plate in a manner that maintains the substantially constant temperature in said portion of said substrate plate along the sealing line which has the electrode free regions and the electrode occupied regions.

23. The method of claim 15, wherein said sealing apparatus emits a lower power laser beam used to melt said portion of said substrate plate along the sealing line during a first pass and then said sealing apparatus emits a higher power laser beam during a second pass only at portions of said portion of said substrate plate along the sealing line which did not reach a correct temperature during the first pass of said lower power laser beam.

24. The method of claim 15, wherein said sealing apparatus uses an elliptical focusing lens to emit an elliptical shaped laser beam to melt said portion of said substrate plate in a manner that maintains the substantially constant temperature in said portion of said substrate plate along the sealing line which has the electrode free regions and the electrode occupied regions.

25. The method of claim 15, wherein said sealing apparatus uses a focusing lens and a specially shaped aperture to emit a defocused laser beam to melt said portion of said substrate plate in a manner that maintains the substantially constant temperature in said portion of said substrate plate along the sealing line which has the electrode free regions and the electrode occupied regions.

26. The method of claim 15, wherein a feedback mechanism is used to optimize an operation of said sealing apparatus so as to melt said portion of said substrate plate in a manner that maintains the substantially constant temperature in said portion of said substrate plate along the sealing line which has the electrode free regions and the electrode occupied regions.

27. The method of claim 15, wherein a mask is placed on top of said cover plate while said sealing apparatus emits a laser beam through a slit in said mask and said cover plate to melt said portion of said substrate plate in a manner that maintains the substantially constant temperature in said portion of said substrate plate along the sealing line which has the electrode free regions and the electrode occupied regions.

* * * * *

UNITED STATES PATENT AND TRADEMARK OFFICE
CERTIFICATE OF CORRECTION

| | |
|---|---|
| PATENT NO. | : 7,371,143 B2 |
| APPLICATION NO. | : 10/970319 |
| DATED | : May 13, 2008 |
| INVENTOR(S) | : Keith James Becken et al. |

Page 1 of 1

It is certified that error appears in the above-identified patent and that said Letters Patent is hereby corrected as shown below:

| Col. | Line | Description |
|---|---|---|
| 12 | 28 | Reads "depositing a fit onto said..." Should read --depositing a frit onto said...-- |
| 12 | 33 | Reads "...in said flit along..." Should read --...in said frit along...-- |

Signed and Sealed this

Twenty-second Day of July, 2008

JON W. DUDAS
*Director of the United States Patent and Trademark Office*